(12) United States Patent
Ausserlechner

(10) Patent No.: US 6,801,087 B2
(45) Date of Patent: Oct. 5, 2004

(54) INTEGRATED CIRCUIT WITH AN ANALOG AMPLIFIER

(75) Inventor: Udo Ausserlechner, Villach (AT)

(73) Assignee: Infineon Technologies AG, Munich (DE)

(*) Notice: Subject to any disclaimer, the term of this patent is extended or adjusted under 35 U.S.C. 154(b) by 117 days.

(21) Appl. No.: 10/331,923

(22) Filed: Dec. 30, 2002

(65) Prior Publication Data

US 2003/0122618 A1 Jul. 3, 2003

Related U.S. Application Data

(63) Continuation of application No. PCT/DE01/02023, filed on May 30, 2001.

(30) Foreign Application Priority Data

Jun. 28, 2000 (DE) .......................................... 100 31 521

(51) Int. Cl.[7] .............................................. H03F 3/45
(52) U.S. Cl. ...................... 330/255; 330/260; 330/265; 330/98; 330/99; 330/100
(58) Field of Search ................................ 330/255, 260, 330/265, 98, 99, 100

(56) References Cited

U.S. PATENT DOCUMENTS

| | | | |
|---|---|---|---|
| 3,693,106 A | * | 9/1972 | Long et al. .................... 330/17 |
| 5,315,266 A | | 5/1994 | Lorenz |
| 5,446,412 A | * | 8/1995 | Kimyacioglu et al. ...... 330/285 |
| 5,515,005 A | | 5/1996 | Yoshioka |
| 5,982,158 A | * | 11/1999 | Schnars et al. ............. 330/109 |

FOREIGN PATENT DOCUMENTS

JP 0722928 * 8/1995

OTHER PUBLICATIONS

Eschauzier et al. "A Programmable 1.5V CMOS Class–AB Operational Amplifier with Hybrid Nested Miller Compensation for 120 dB Gain and 6 MHz UGF." 1994 IEEE International Solid–State–Circuits Conference 41st ISSCL Feb. 16–18, 1994 pp. 246–247.*

Goodenough, F.: "Sophisticated Techniques are being Applied to Lower Voltage and Power Levels for Analog ICs", Electronic Design, vol. 45, No. 19, Sep. 2, 1997, pp. 31, 34, 36, 38.

de Bruyn, W.: "Error Feedback in Audio Power", Electronics World, Jun. 1997, pp. 476–478.

Tietze, U. et al.: "Halbleiterschalungstechnik" [Semiconductor Circuitry], Springer Verlag, Berlin Heidelberg, Ed. 9, 1990, pp. 140 and 433.

Tietze, U. et al.: "Halbleiter–Schaltungstechnik" [Semiconductor Circuitry], Springer Verlag, Berlin Heidelberg, Ed. 11, 1999, p. 523.

(List continued on next page.)

*Primary Examiner*—Michael B Shingleton
(74) *Attorney, Agent, or Firm*—Laurence A. Greenberg; Werner H. Stemer; Ralph E. Locher

(57) ABSTRACT

An integrated circuit includes an analog amplifier connected to a terminal pad and has a Miller compensation of a section of the analog amplifier. The Miller compensation circuit is connected to a terminal for reference-ground potential through a capacitive element. An EMC interference radiation that can be coupled in through the terminal pad is attenuated by the capacitive element. The operating points of the internal nodes of the analog amplifier are, thereby, stabilized.

10 Claims, 4 Drawing Sheets

OTHER PUBLICATIONS

Pernici, S. et al.: "A CMOS Low–Distortion Fully Differential Power Amplifier with Double Nested Miller Compensation", IEEE Journal of Solid–State Circuits, vol. 28, No. 7. Jul. 1993. pp. 758–763.

Laker, Sansen: "Design of Analog Integrated Circuits and Systems", [no date known], p. 487.

Hogervorst, Huujsing: "Design of Low Voltage, Low–Power Operational Amplifier Cells" [no date known], pp. 150, 188.

* cited by examiner

INTEGRATED CIRCUIT WITH AN ANALOG AMPLIFIER

CROSS-REFERENCE TO RELATED APPLICATION

This application is a continuation of copending International Application No. PCT/DE01/02023, filed May 30, 2001, which designated the United States and was not published in English.

BACKGROUND OF THE INVENTION

1. Field of the Invention

The invention relates to an integrated circuit with an output stage that includes an analog amplifier connected, on the output side, to a terminal pad for the outputting of an amplified output signal.

In integrated circuits with analog signal processing, operational amplifiers or operational transconductance amplifiers (OTA), for example, are provided for outputting output signals to lines external to the circuit. As a result, the output signal is output with high driver power from the integrated circuit to a line on a circuit board. In conventional operational amplifiers or OTAs as presented for example in Tietze, Schenk: "Halbleiterschaltungstechnik", ["Semiconductor Circuitry"], 9th Edition, 1991, page 140; Hogervorst, Huijsing: "Design of Low-Voltage, Low-Power Operational Amplifier Cells", pages 150 and 188; Laker, Sansen: "Design of Analog Integrated Circuits and Systems", page 487, a capacitive feedback path is connected to the output terminal. The amplifiers are connected up with feedback networks, each individual amplifier stage effecting a phase shift in the signal path. To avoid positive feedback signal components, high frequency components are attenuated by the capacitive feedback mentioned.

A bonding wire is usually connected to the terminal pad for the outputting of the output signal from the integrated circuit, the bonding wire connecting the terminal pad to a terminal pin of the housing. This configuration acts as a receiving antenna for high-frequency interference radiations that can be generated by adjacent circuit components, for example. The signal path that is formed by the capacitive feedback but has low resistance for high frequencies leads from the terminal pad back into the circuit. The high-frequency interference radiation, so-called electromagnetic compatibility (EMC) interference, which is substantially received by the bonding wire is rectified by the pn junctions present in the integrated circuit. The currents injected as a result shift the operating points of the circuits in the integrated circuit. Inputs of amplifier stages are usually embodied with high resistance. As a result, currents so injected noticeably interfere with the signal processing.

The reference De Bruyn, William: "Error feedback in audio power", Electronics World, June 1997, pages 476 to 478, in particular, FIG. 1 therein, shows an analog amplifier with a first amplifier stage, containing a differential amplifier, and also an output stage, in the case of which the output is fed back through resistive and capacitive elements to the output of the differential amplifier stage. The reference Tietze, Schenk: "Halbleiter-Schaltungstechnik" shows differential amplifiers with a first amplifier stage and a second amplifier stage connected downstream, in the case of which the output of the amplifier stage is fed back to the input, in particular, in the 9th Edition, 1990, pages 140 and 433, and the 11th Edition, 1999, page 523. The principle of amplifiers with nested Miller compensation is described in Pernici, Sergio et al.: "A CMOS Low-Distortion Fully Differential Power Amplifier with Double Nested Miller Compensation", IEEE Journal of Solid-State Circuits, Volume 28, No. 7, July 1993, pages 758 to 763.

SUMMARY OF THE INVENTION

It is accordingly an object of the invention to provide an integrated circuit with an analog amplifier that overcomes the hereinafore-mentioned disadvantages of the heretofore-known devices of this general type and that has an output-side analog amplifier with a higher strength with respect to electromagnetic coupling-in.

With the foregoing and other objects in view, there is provided, in accordance with the invention, an integrated circuit, including an input terminal for feeding in an input signal to be amplified, an output terminal for outputting an amplified output signal, a terminal pad connected to the output terminal for outputting the output signal, a terminal for a reference-ground potential, and an analog amplifier having a first input-side amplifier section having a first signal path and an output, a second output-side amplifier section having a second signal path, the first and second signal paths connected in series and a transistor having a control terminal coupled to the output of the first input-side amplifier section and a controlled current path coupled to the terminal for the reference-ground potential and to the output terminal, a series circuit having a resistor, a capacitive element, a node between the resistor and the capacitive element, and ends, one of the ends of the series circuit connected to the output terminal, and another of the ends of the series circuit connected to the control terminal, and a further capacitive element connected between the node and the terminal for the reference-ground potential.

According to the invention, the integrated circuit has an analog amplifier, which includes an input terminal for feeding in an input signal to be amplified and also an output terminal for outputting an amplified output signal, a terminal pad, which is connected to the output terminal of the analog amplifier and serves for the outputting of an output signal from the integrated circuit, the analog amplifier including a first input-side amplifier section and a second output-side amplifier section, whose signal paths are connected in series, and a series circuit including a resistor and a capacitive element, which is connected at one end to the output terminal of the analog amplifier, a node being formed between the resistor and the capacitive element of the series circuit, in which case the second amplifier section includes a transistor, whose control terminal is coupled to an output of the first amplifier section and whose controlled current path is coupled to a terminal for a reference-ground potential and to the output terminal of the analog amplifier, in which case the series circuit including the resistor and the capacitive element is connected at the other end to the control terminal of the transistor, and in which case a further capacitive element is provided, which is connected between the node and the terminal for the reference-ground potential.

In the case of the integrated circuit according to the invention, interference coupled in at high frequency through the output is attenuated. The capacitive element connected relative to reference-ground potential acts together with the resistor as a low-pass filter so that the coupled-in signal energy of the high-frequency interference is delayed and discharged to reference-ground potential. As a result, less charge is injected into the interior of the integrated circuit. Although low-frequency interference is, nevertheless, conducted further, it is detected by the control dynamic range of the analog amplifier and corrected.

The analog amplifier may be, for example, an operational amplifier that has a high-resistance input, effects analog amplification of the useful signal, and provides a low-resistance signal on the output side. By contrast, an OTA has a high-resistance output that supplies a current-controlled output signal. Operational amplifiers and OTAs are of multistage construction. A differential amplifier stage that operates differentially is provided on the input side, a further amplifier being connected downstream of the stage on the output side. The further amplifier substantially includes an amplifier transistor. The output of the analog amplifier and the input of this second amplifier stage exhibit capacitive feedback, which feedback includes the series circuit formed by a resistor and a capacitive element, the coupling node between capacitive element and resistor, in turn, being capacitively connected to reference-ground potential. The resistor is connected into the feedback loop between the output of the second amplifier stage and the input thereof. As an alternative, the resistor is connected between the output terminal of the analog amplifier, which is connected to the terminal pad, and the output terminal of the second amplifier stage.

In accordance with another feature of the invention, the second output-side amplifier section has an output and the resistor is connected between the output terminal and the output of the second amplifier section.

In accordance with a further feature of the invention, the second output-side amplifier section has an output and the resistor is connected between the output of the second output-side amplifier section and the node.

In accordance with an added feature of the invention, the resistor is connected between the output of the second output-side amplifier section and the node.

In accordance with an additional feature of the invention, the first input-side amplifier section is a differential amplifier.

In accordance with yet another feature of the invention, the analog amplifier is an operational amplifier or an operational transconductance amplifier.

In a development of the invention, a third amplifier stage is provided, which is connected between the output of the input-side differential amplifier and the input of the output-side amplifier stage. In such a case, a further feedback is connected between the output of the analog amplifier and the input of the third amplifier stage or the output of the input-side differential amplifier. Such a feedback path is embodied in accordance with the feedback path associated with the second amplifier stage.

In accordance with yet a further feature of the invention, there are provided a third amplifier section having an input and a signal path connected between the first input-side amplifier section and the second output-side amplifier section, a second series circuit having a second resistor, a second capacitive element, and a second node between the second resistor and the second capacitive element, the second series circuit connected between the output terminal and the input of the third amplifier section, and a further capacitive element connecting the second node to the terminal for the reference-ground potential.

In accordance with yet an added feature of the invention, the second output-side amplifier section is a differential second output-side amplifier section having an input, a third series circuit has a third resistor, a third capacitive element, a third node between the third resistor and the third capacitive element, the third series circuit couples the input of the differential second output-side amplifier section to the output terminal, and another capacitive element connects the third node to the terminal for the reference-ground potential.

In accordance with yet an additional feature of the invention, the second output-side amplifier section is a differential second output-side amplifier section having an input, a second series circuit has a second resistor, a second capacitive element, a second node between the second resistor and the second capacitive element, and the second series circuit couples the input of the differential second output-side amplifier section to the output terminal, and a further capacitive element connects the second node to the terminal for the reference-ground potential.

The capacitive element connecting the feedback path to reference-ground potential is, on one hand, to be given sufficiently small dimensions so that the transfer response of the feedback analog amplifier is not significantly impaired, i.e., the phase margin of its transfer function is not shifted toward lower frequencies. On the other hand, however, the capacitive element must be chosen to be large enough so that the interference radiations coupled in at high frequency are adequately attenuated. In practice, the time constant formed from the resistor and the capacitive element should be five to ten times greater than the transition frequency of the analog amplifier to achieve the advantageous effects mentioned above.

In the application of amplifiers, it is usually endeavored to keep the capacitive loading of the amplifier input as small as possible to achieve the highest possible transition frequency and sufficient gain even at high signal frequencies. In the case of the invention, by contrast, an additional loading is applied to the input of the output-side amplifier section of the analog amplifier by the capacitive element connected to reference-ground potential. Given suitable dimensioning, however, an improved behavior with respect to the coupling-in of electromagnetic interference radiation results, surprisingly, for such an amplifier disposed at the output of the integrated circuit.

With the objects of the invention in view, in an integrated circuit having an input terminal for feeding in an input signal to be amplified, an output terminal for outputting an amplified output signal, and a terminal pad connected to the output terminal for outputting the output signal, there is also provided an analog amplifier including a first input-side amplifier section having a first signal path and an output, a second output-side amplifier section having a second signal path, the first and second signal paths connected in series and a transistor having a control terminal coupled to the output of the first input-side amplifier section and a controlled current path coupled to the terminal for the reference-ground potential and to the output terminal, a series circuit having a resistor, a capacitive element, a node between the resistor and the capacitive element, and ends, one of the ends of the series circuit connected to the output terminal, and another of the ends of the series circuit connected to the control terminal and a further capacitive element connected between the node and the terminal for the reference-ground potential.

With the objects of the invention in view, there is also provided an analog amplifier for amplifying an input signal, including a terminal for a reference-ground potential, a first input-side amplifier section having a first signal path and an output, a second output-side amplifier section having a second signal path, the first and second signal paths connected in series and a transistor having a control terminal coupled to the output of the first input-side amplifier section and a controlled current path coupled to the terminal for the reference-ground potential, the controlled current path to be coupled to an output terminal for outputting an amplified output signal, a series circuit having a resistor, a capacitive element, a node between the resistor and the capacitive element, and ends, one of the ends of the series circuit to be connected to the output terminal, and another of the ends of the series circuit connected to the control terminal, and a further capacitive element connected between the node and the terminal for the reference-ground potential.

Other features that are considered as characteristic for the invention are set forth in the appended claims.

Although the invention is illustrated and described herein as embodied in an integrated circuit with an analog amplifier, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
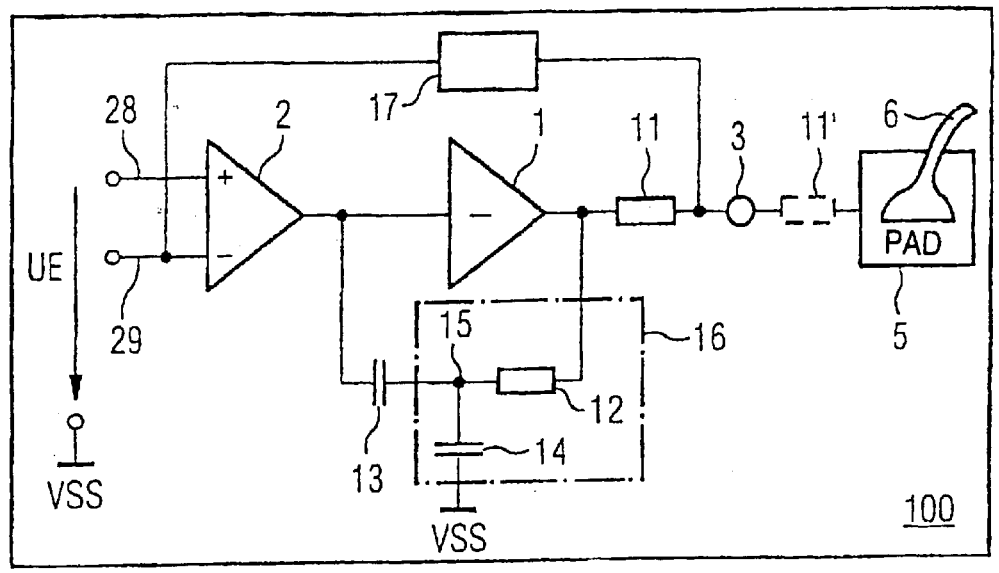
FIG. 1 is a block and schematic circuit diagram of a first exemplary embodiment of a circuit according to the invention with an analog amplifier whose second amplifier section has a capacitive and low-pass-filter-conforming feedback.

Referring now to the figures of the drawings in detail and first, particularly to FIG. 1 thereof, there is shown an analog amplifier including a first, input-side amplifier section 2, which has differential input signal terminals 28, 29 for feeding in an input signal to be amplified. A second amplifier section 1 is connected downstream of the first amplifier section 2 on the output side. The analog amplifier has an output terminal 3, which is connected to the output of the second amplifier section 1 through a resistor 11. If appropriate, the resistor 11 can also be omitted.

The analog amplifier 1, 2 is realized in integrated fashion on an integrated circuit chip 100. The analog amplifier serves as an output driver for the outputting of signals from the chip. For such a purpose, the output terminal 3 is connected to a terminal pad 5. A bonding wire 6 is stamped onto the pad, which bonding wire 6 produces a connection to a terminal pin of the housing surrounding the integrated circuit 100.

Figure 3:
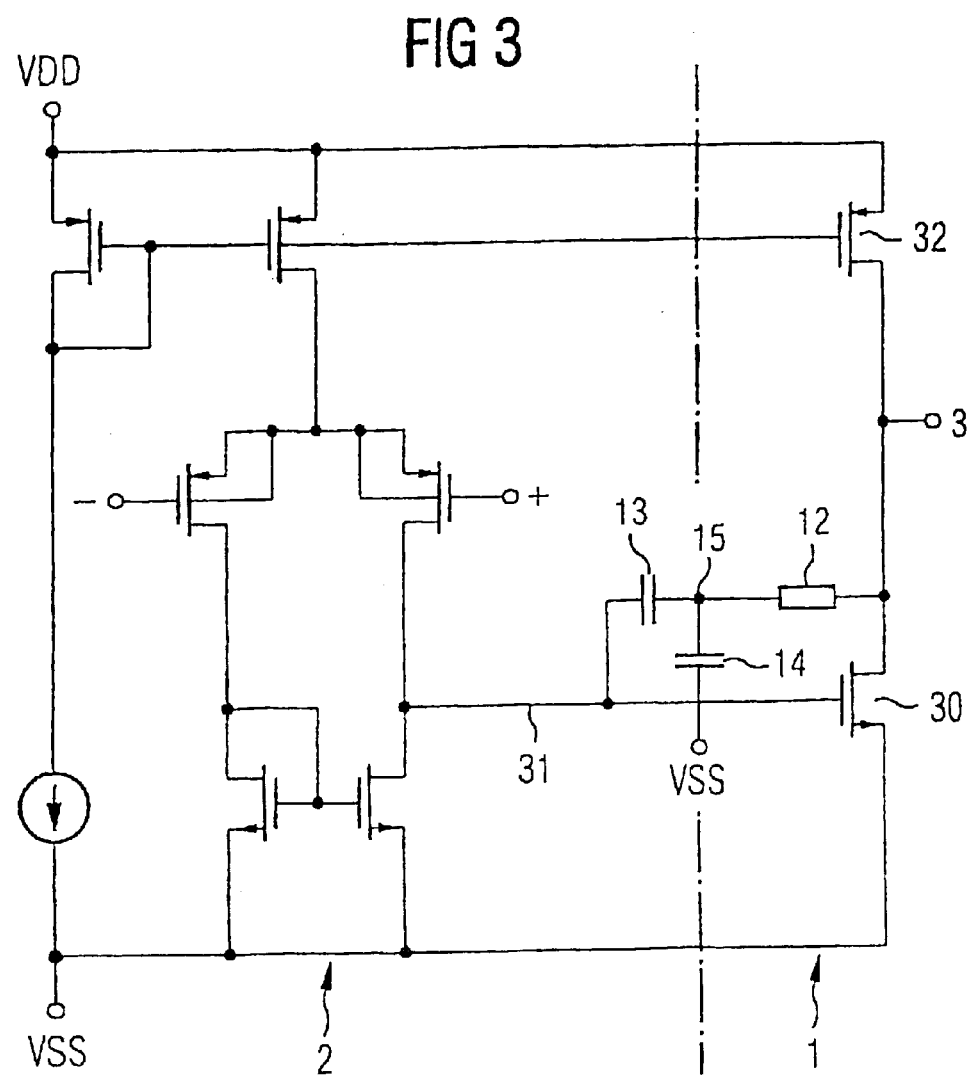
FIG. 3 is a schematic circuit diagram of the embodiment of FIG. 1.

FIG. 3 shows the circuitry realization of the analog amplifier sections 2, 1 in detail. Corresponding elements are in each case provided with identical reference symbols in different figures. The output-side amplifier section 1 has an amplifier transistor 30, which is driven through a line 31 from the output of the first amplifier section 2. The source terminal of the amplifier transistor 30 is connected to the reference-ground potential VSS (ground). Current is fed to the drain terminal of the amplifier transistor 30 through a transistor 32 disposed at the region of the supply potential VDD. The output terminal 3 of the entire analog amplifier is connected to the coupling node of the transistors 30, 32. The resistor 11, which can be omitted if appropriate, is not illustrated in FIG. 3.

Conventionally, the output of the second amplifier section 1 is fed back capacitively to its input, for example, through the capacitance 13. A resistor 12 is additionally provided in the feedback path. The resistor 11 (FIG. 1) connected into the output line also suffices instead of the resistor 12. Such capacitive feedback serves for frequency compensation, so-called Miller compensation. Because, as is conventional, the amplifier chain 2, 1 is additionally connected up with external components, in particular, in a manner that exhibits feedback, and each amplifier stage inherently generates a phase shift, a positive feedback effect can arise in the case of unfavorable connections and signal driving. The Miller compensation, e.g., capacitance 13 and, if appropriate, resistor 12 connected in series therewith, serves to compensate for zeros in the transfer function of the entire circuit. Instabilities tending toward oscillation are compensated for in this way. In principle, the action of the Miller compensation lies in attenuating high-frequency signal components at the output-side amplifier section so that the gain in this respect is less than 1 and the positive feedback tendency for these frequencies is avoided.

According to the invention, a further capacitance 14 is provided, which is connected to the coupling node between the capacitance 13 and the resistor 12, or (not illustrated) to the coupling node between the capacitance 13 and the resistor 11, if the resistor 12 is not present. The other terminal of the capacitance 14 is connected to reference-ground potential VSS (ground). The capacitance 14 has a low-pass filter action, which means that low-frequency signal components are short-circuited to reference-ground potential. The low-pass filter characteristic is formed in the interaction of the capacitance 14 with the resistor 12 or the resistor 11 or the sum of the resistors 11 and 12. In the event of an electromagnetic interference radiation, a so-called EMC pulse, being coupled into the analog amplifier through the output terminal 3, without the capacitance 14 the EMC pulse would be forwarded into internal regions of the analog amplifier on account of the low-resistance path formed by the capacitance 13. The pn junctions formed by the transistors of the analog amplifier would rectify the interference radiation and could significantly shift operating points within the circuit. This is critical, in particular, by virtue of the fact that the input terminal of the second amplifier section 1, i.e., the gate terminal of the transistor 30 in the exemplary embodiment of FIG. 3, is at high resistance and reacts sensitively to the coupling-in of charge. Through the provision of the capacitance 14, however, and the resultant low-pass filter property of the feedback signal path, EMC pulses are delayed, attenuated and largely discharged to ground. Coupled-in EMC interference radiation can, then, no longer significantly shift the operating points within the analog amplifier.

The capacitance 14 is to be dimensioned in a suitable manner. It must be small enough not to impair the phase margin of the feedback amplifier in an undesirable manner. On the other hand, the capacitance 14 must be chosen to be large enough to attenuate low-frequency EMC interference sufficiently well. Furthermore, it must be ensured that the value of the resistor 12 is expediently to be chosen to be greater than would otherwise be necessary without the provision of the capacitance 14, in order to compensate for the zero in the transfer function. This also applies in a corresponding manner to the resistor 11, if the resistor 12 is not present, or to the sum of the values of the resistors 12 and 11 if both resistors 12 and 11 are present. In practice, the time constant of the low-pass filter formed by resistor 12 and capacitance 14 (or resistor 11 or sum of the values of the resistors 11 and 12) should be chosen to be greater than 5 to 10 times the transition frequency (0 dB limit of the transfer function) of the second amplifier section 1. Low-frequency EMC interference is, then, attenuated. Although even lower EMC interference going beyond the latter is fed back, it is corrected sufficiently well by the second amplifier section 1 so that circuit-internal nodes cannot be charged by such low EMC interference. If, by way of example, the transition frequency of the output amplifier is 100 kHz, then the time constant from the low-pass filter formed from capacitance 14 and resistor 12 is to be dimensioned at greater than 500 kHz. As already explained, instead of the resistor 12, the resistor 11 can be inserted and dimensioned accordingly. As an alternative, it is also possible to provide both resistors 11 and 12, the dimensioning considerations then relating to the sum of the values of the resistors 11 and 12.

Figure 4:
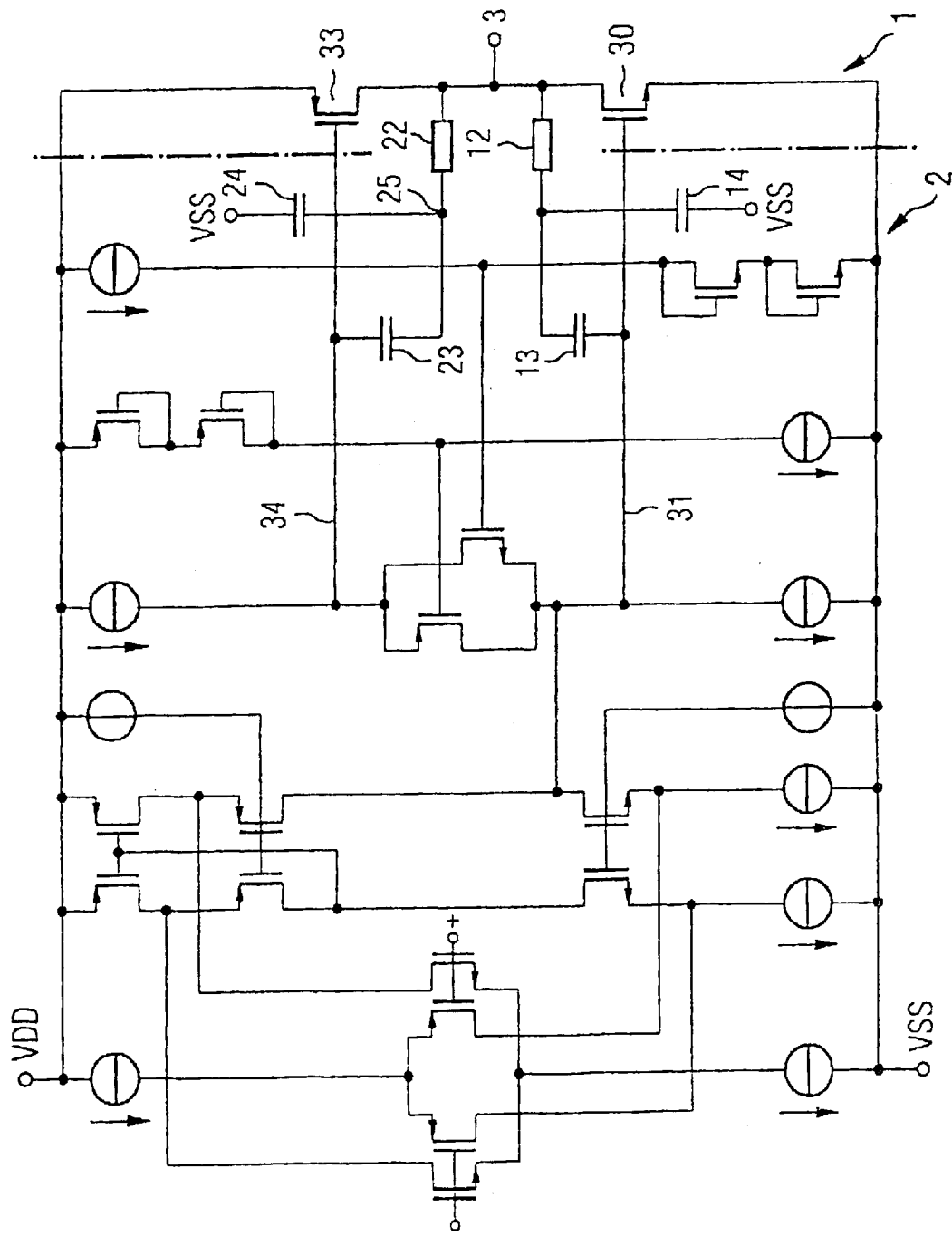
FIG. 4 is a block and schematic circuit diagram of a third exemplary embodiment of the circuit according to the invention with the analog amplifier having a second amplifier section of differential embodiment.

FIG. 4 shows a modified analog amplifier having two amplifier sections 2, 1. One difference from the circuit illustrated in FIG. 3 is that the output stage 1 operates differentially. This means that two signal-amplifying transistors 30, 33 are provided having a complementary channel type, whose drain-source paths are connected in series with one another and between the supply voltage VDD, VSS. The two transistors are driven by a signal that is to be amplified, through respective signal lines 31 and 34. The signal carried by the signal line 34 behaves in a complementary manner in comparison with the signal carried by the signal line 31. As in FIG. 3, the Miller compensation of the transistor 30 is supplemented additionally by the capacitance 14 with a low-pass-filter-conforming characteristic. The transistor 33 also has a Miller compensation through the series circuit formed by a capacitance 23 and a resistor 22. This series circuit is connected between the output 3 of the second amplifier section 1 and the corresponding signal input 34, i.e., the gate terminal of the transistor 33. A capacitor 24 is additionally provided, which is connected between the coupling node between capacitance 23 and resistor 22 and reference-ground potential VSS (ground). The measures set forth with reference to FIG. 3 apply correspondingly to the dimensioning and the augmentation with a resistor connected into the output signal path, in a manner comparable with the resistor 11 in FIG. 1.

Figure 2:
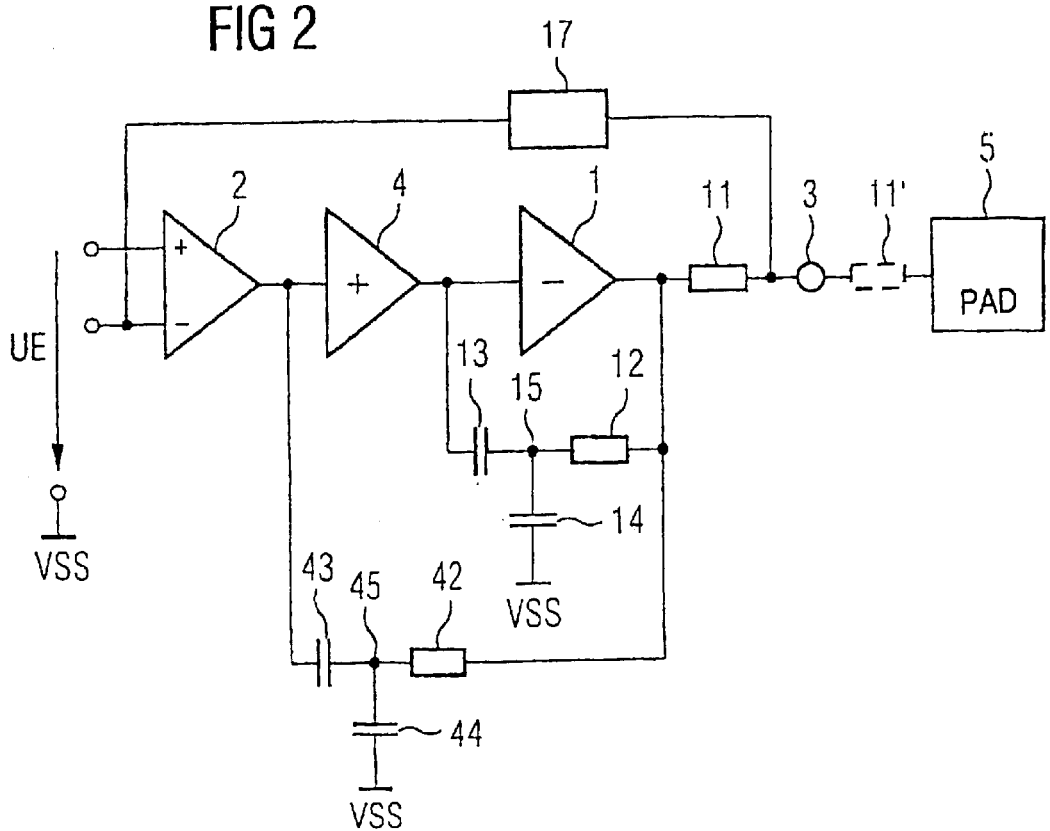
FIG. 2 is a block and schematic circuit diagram of a second exemplary embodiment of the circuit according to the invention with a further central amplifier section and respective feedbacks.

As is conventional, analog amplifiers can also have further amplifier sections. Thus, in FIG. 2, a further amplifier section 4 is connected between the input-side amplifier section 2 provided with a differential signal input and the output-side amplifier section 1. As illustrated with reference to FIGS. 1 and 3, the output-side amplifier section 1 is provided with the Miller compensation 12, 13, 14 augmented in accordance with the invention. The amplifier 14 also has a corresponding compensation network. Conventionally, only a series circuit including a capacitance 43 and a resistor 42 is known for frequency compensation. If appropriate, the resistor 42 can be omitted if, as illustrated in FIG. 2, a resistor 11 is connected into the output signal line. Such frequency compensation is called nested Miller compensation. The coupling node between capacitance 43 and resistor 42 is, now, additionally connected through a capacitance 44 to reference-ground potential VSS. The capacitance 44, in interaction with the resistor 42 or the resistor 11 or the series circuit of resistors 42, 11, generates a low-pass filter characteristic that attenuates low-frequency EMC interference pulses and discharges them to ground so that circuit-internal nodes can no longer be appreciably charged. The transition frequency of the total transfer function formed from the amplifiers 4 and 1 is now to be taken as a basis with regard to the dimensioning of the low-pass filter action.

Figure 5:
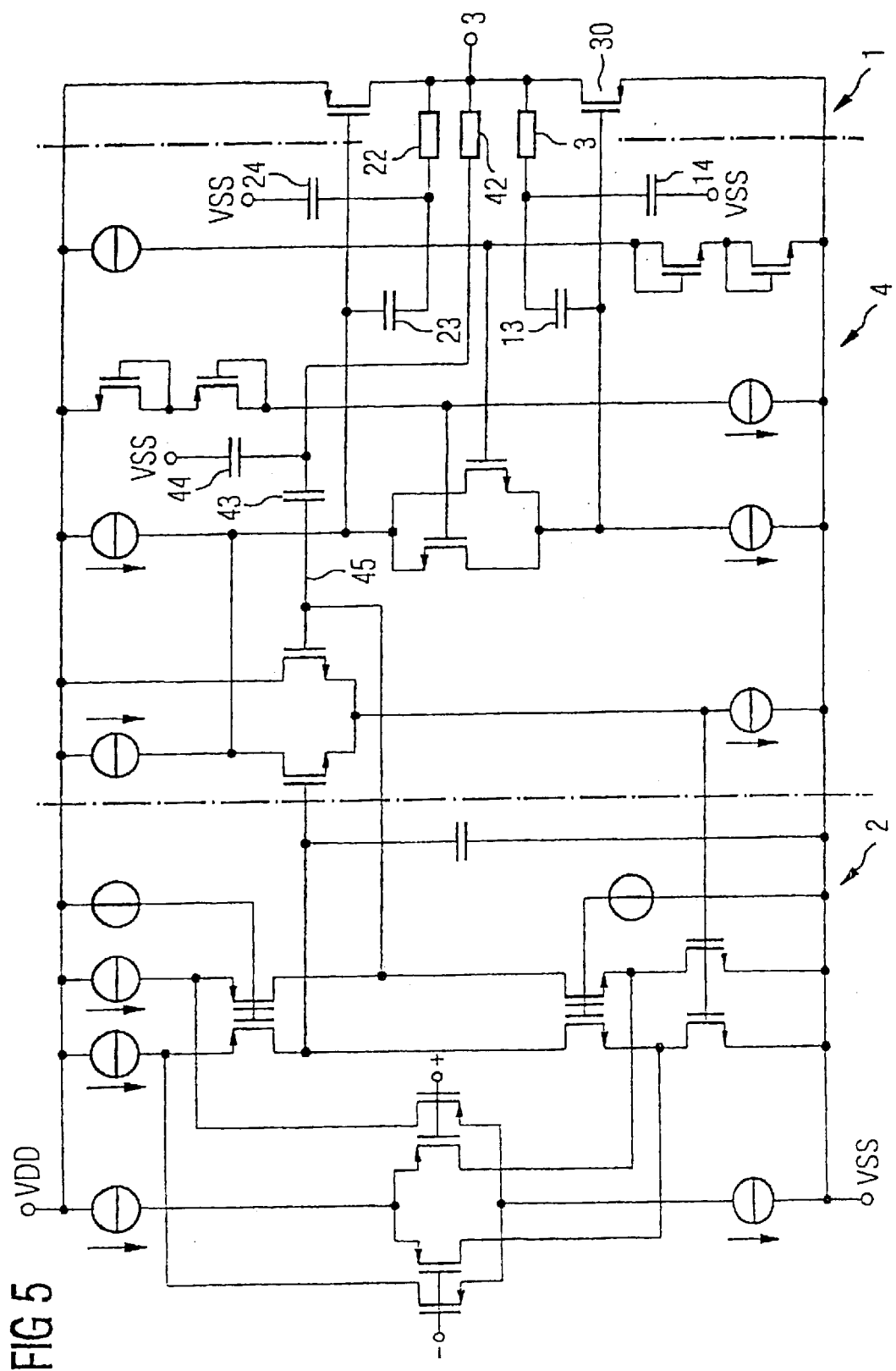
FIG. 5 is a schematic circuit diagram of the embodiment of FIG. 2.

FIG. 5 shows a circuitry detail realization of the analog amplifier circuit illustrated only in principle in FIG. 2. The amplifier sections 1, 4 are already embodied using differential signal technology. One of the signal inputs 45 of the amplifier section 4 is connected, with the series circuit including capacitance 43 and resistor 42, to the output terminal 3 of the analog amplifier for Miller compensation. The coupling node between capacitance 43 and resistor 42 is connected to reference-ground potential VSS through the capacitance 44.

The invention can be applied to so-called operational amplifiers (OpAmps) that have a small output resistance and supply a voltage-driven output signal. The invention can additionally be applied to operational transconductance amplifiers (OTAs), which have a construction similar to that of an operational amplifier with the difference that the output is operated at high resistance and supplies a current-driven output signal.

I claim:

1. An integrated circuit, comprising:
   an input terminal for feeding in an input signal to be amplified;
   an output terminal for outputting an amplified output signal;
   a terminal pad connected to said output terminal for outputting the output signal;
   a terminal for a reference-ground potential; and
   an analog amplifier having:
      a supply potential terminal;
      a first input-size amplifier section having a first signal path and an output;
      a second output-side amplifier section having:
         a second signal path, said first and second signal paths connected in series;
         a control terminal coupled to said output of said first input-side amplifier section,
         a drain terminal coupled to said output terminal and a source terminal directly connected to said terminal for the reference-ground potential; and
      a further transistor connecting said transistor to said supply potential terminal;
   a series circuit having a resistor, a capacitive element, a node between said resistor and said capacitive element, and ends, one of said ends of said series circuit connected to said output terminal, and another of said ends of said series circuit connected to said control terminal; and
   a further capacitive element connected between said mode and said terminal for the reference-ground potential.

2. The integrated circuit according to claim 1, wherein:
   said second output-side amplifier section has an output; and
   said resistor is connected between said output terminal and said output of the second amplifier section.

3. The integrated circuit according to claim 1, wherein:
said second output-side amplifier section has an output; and said resistor is connected between said output of said second output-side amplifier section and said node.

4. The integrated circuit according to claim 2, wherein said resistor is connected between said output of said second output-side amplifier section and said node.

5. The integrated circuit according to claim 1, wherein said first input-side amplifier section is a differential amplifier.

6. The integrated circuit according to claim 1, wherein said analog amplifier is an operational amplifier.

7. The integrated circuit according to claim 1, wherein said analog amplifier is an operational transconductance amplifier.

8. The integrated circuit according to claim 1, including:
a third amplifier section having:
an input; and
a signal path connected between said first input-side amplifier section and said second output-side amplifier section;

a second series circuit having a second resistor, a second capacitive element, and a second node between said second resistor and said second capacitive element, said second series circuit connected between said output terminal and said input of said third amplifier section; and a further capacitive element connecting said second node to said terminal for the reference-ground potential.

9. The integrated circuit according to claim 8, wherein:
said second output-side amplifier section is a differential second output-side amplifier section having an input;

a third series circuit has a third resistor, a third capacitive element, a third node between said third resistor and said third capacitive element, said third series circuit couples said input of said differential second output-side amplifier section to said output terminal; and another capacitive element connects said third node to said terminal for the reference-ground potential.

10. The integrated circuit according to claim 1, wherein:
said second output-side amplifier section is a differential second output-side amplifier section having an input;

a second series circuit has a second resistor, a second capacitive element, a second node between said second resistor and said second capacitive element, and said second series circuit couples said input of said differential second output-side amplifier section to said output terminal; and a further capacitive element connects said second node to said terminal for the reference-ground potential.

* * * * *